United States Patent [19]

McEntarfer et al.

[11] Patent Number: 5,124,663

[45] Date of Patent: Jun. 23, 1992

[54] OFFSET COMPENSATION CMOS OPERATIONAL AMPLIFIER

[75] Inventors: Philip W. McEntarfer, Gilbert; Dejan Mijuskovic, Chandler, both of Ariz.

[73] Assignee: Motorola, Inc., Schaumburg, Ill.

[21] Appl. No.: 663,485

[22] Filed: Mar. 4, 1991

[51] Int. Cl.$^5$ .............................................. H03F 1/02
[52] U.S. Cl. ........................................ 330/9; 330/51; 330/253; 330/295
[58] Field of Search ...................... 330/9, 51, 253, 261, 330/295

[56] References Cited

U.S. PATENT DOCUMENTS

| | | | |
|---|---|---|---|
| 4,190,805 | 2/1980 | Bingham | 330/9 |
| 4,628,274 | 12/1986 | Vittoz et al. | 330/9 |
| 4,808,942 | 2/1989 | Milkovic | 330/9 |
| 4,884,039 | 11/1989 | King et al. | 330/9 X |
| 4,933,643 | 6/1990 | Jandu et al. | 330/9 |

FOREIGN PATENT DOCUMENTS 129644 1/1985 European Pat. Off.

Primary Examiner—James B. Mullins
Attorney, Agent, or Firm—Robert D. Atkins

[57] ABSTRACT

An amplifier circuit with internal offset cancellation receives a differential input signal and provides differentially related currents which flow through first and second conduction paths of a differential-to-signal-ended converter for providing an output signal. Although ideally the differentially related currents should be equal with a zero differential input signal, the inherent mismatches between the transistors of the amplifier produce error currents causing the offset error. During an auto-zero phase, the differential input signal is zeroed while first and second capacitors are connected to the first and second conduction paths of the differential-to-single-ended converter for storing a charge representative of the input offset voltage. During the operational phase, the capacitor voltages control first and second transistors operating in parallel with the first and second conduction path for removing any error current thereby providing compensation of the offset error for the differential input signal.

10 Claims, 3 Drawing Sheets

1

OFFSET COMPENSATION CMOS OPERATIONAL AMPLIFIER

FIELD OF THE INVENTION

This invention relates in general an amplifier and, more particularly, to an operational amplifier having improved offset cancellation.

BACKGROUND OF THE INVENTION

The input offset voltage of an operational amplifier is an important consideration when constructing a precision CMOS amplifier. Ideally, the operational amplifier should provide a zero output voltage absent an applied differential input voltage signal. However, due to the inherent transistor mismatches in most, if not all, operational amplifiers a zero differential input signal can produce a non-zero output signal without some form of input offset voltage cancellation to compensate for the internal offset error of the amplifier. The offset error is typically present over the entire operating range of the amplifier. Traditional offset compensation techniques may involve chopping the input signal and filtering the output voltage in continuous time applications. Unfortunately, this approach requires a high frequency signal much greater than the bandwidth of the amplifier to chop the input signal.

Another method involves storing an input offset voltage across a capacitor coupled in series with the inverting input terminal of the operational amplifier to compensate the input signal for errors induced by the amplifier mismatches. During an auto-zero phase, switching circuits are closed to configure the operational amplifier as a unity gain buffer while a reference potential is applied through the series capacitor to the inverting input terminal which appears at the output of the amplifier modified by the internal offset thereof. The input offset voltage is thereby stored across the series capacitor. During the operational phase, the reference potential is replaced with the input signal whereby the input offset voltage stored across the capacitor is subtracted from the input signal and added back as the input signal propagates through the operational amplifier thereby cancelling the internal offset error. However, any error or leakage appearing on the series capacitor affects the input offset compensation. The method of storing the input offset voltage across the series capacitor is preferable for systems using sampling since it allows time for the auto-zero phase.

The series capacitor offset compensation technique for the CMOS operational amplifier requires unity gain stability in an inverting configuration for proper operation. Non-inverting type operational amplifiers are not supported by the series capacitor cancellation. Moreover, the auto-zero phase limits the continuous time operation of the amplifier in that the input signal must be disabled during the time the input offset voltage is stored across the series capacitor. Therefore, the output signal is available only as chopped bursts.

Hence, what is needed is an improved offset voltage compensation technique for a CMOS operational amplifier in both inverting and non-inverting configurations with continuous time operation.

SUMMARY OF THE INVENTION

Briefly stated, the invention comprises an amplifier circuit comprising a differential transistor input stage having first and second inputs coupled for receiving a differential input signal applied to the differential transistor input stage and having first and second outputs for producing first and second differentially related output signals. A transistor converter stage converts the first and second differentially related output signals received at first and second inputs from the differential transistor input stage to a single-ended output signal, while a circuit is coupled to the first and second inputs of the transistor converter stage for removing any error signal developed by transistor mismatches in the differential transistor input stage and/or the transistor converter stage.

In another aspect, the present invention is a method of providing continuous processing of an input signal through an amplifier while providing offset cancellation comprising the steps of applying the input signal to a first amplifier for processing therethrough while blocking the input signal from a second amplifier and applying a zero differential input signal to the second amplifier for internally storing the offset cancellation thereof. The zero differential input signal is removed from the second amplifier while the input signal is applied to the second amplifier for processing with offset cancellation. The input signal is blocked from the first amplifier while a zero differential input signal is applied to the first amplifier for internally storing the offset cancellation thereof.

In yet another aspect, the present invention is an amplifier circuit comprising a differential transistor input stage having first and second inputs coupled for receiving a differential input signal applied to the differential transistor input stage and having first and second outputs for producing first and second differentially related output currents. A first circuit is responsive to the first and second differentially related output currents for providing a differential output voltage at first and second outputs, while a second circuit is coupled to the first and second outputs of the first circuit for removing any error signal developed by transistor mismatches in the amplifier circuit.

Thus, one advantage of the present invention is the technique of internally compensating for offset error of an operational amplifier while allowing continuous time operation in non-inverting and inverting configurations thereof.

DETAILED DESCRIPTION OF THE PREFERRED EMBODIMENT

Figure 1:
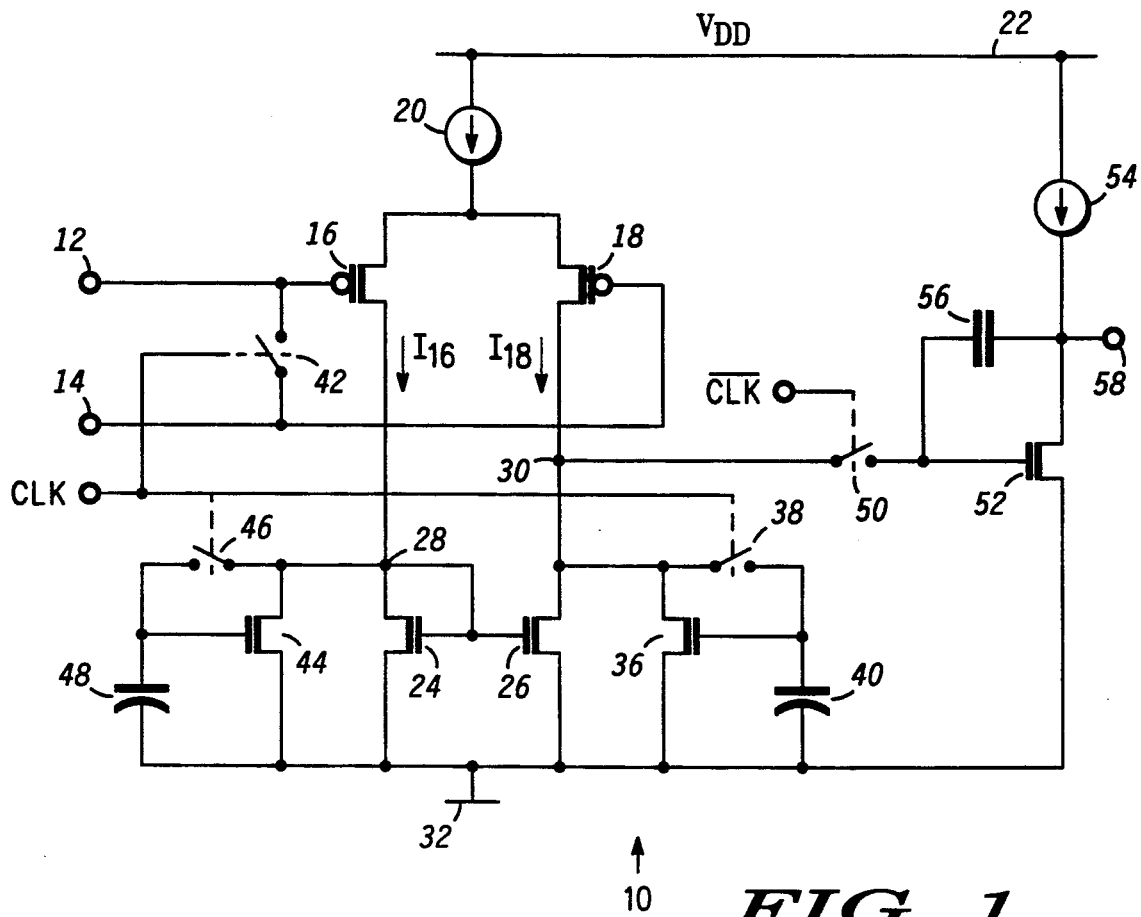
FIG. 1 is a schematic diagram illustrating one embodiment of offset compensation for a CMOS operational amplifier.

Referring to FIG. 1, there is shown operational amplifier (op amp) 10 suitable for manufacturing in integrated circuit form using conventional integrated circuit processes. A differential input signal is applied at inputs 12 and 14 at the gates of transistors 16 and 18. The sources of transistors 16 and 18 are coupled together through current source 20 to power supply conductor 22 typically operating at a positive potential such as $V_{DD}$. The drains of transistors 16 and 18 are coupled to the drains of transistors 24 and 26 at nodes 28 and 30, respectively, while the sources of transistors 24 and 26 are coupled to power supply conductor 32 typically operating at ground potential. The gates of transistors 24 and 26 are coupled together at node 28 forming a conventional differential-to-single-ended converter which in combination with transistors 16 and 18 provides a single-ended output signal at node 30.

An important feature of the present invention is the offset cancellation provided by transistor 36, switching circuit 38 and capacitor 40. Transistor 36 includes a drain coupled to node 30 and a source coupled to power supply conductor 32. Switching circuit 38 is coupled between node 30 and the gate of transistor 36, while capacitor 40 is coupled between the gate and source of the same. Switching circuit 42 is coupled between inputs 12 and 14 for zeroing the differential input signal applied thereto. Another offset compensation circuit including transistor 44, switching circuit 46 and capacitor 48 is coupled to node 28 for providing balanced operation. Transistor 44 has its drain coupled to node 28 and source coupled to power supply conductor 32. Switching circuit 46 is coupled between node 28 and the gate of transistor 44, and capacitor 48 is coupled between the gate and source of transistor 44. Switching circuits 38, 42 and 46 are responsive to control signal CLK for controlling the contact closure thereof.

The single-ended output signal at node 30 is applied through switching circuit 50 to the gate of transistor 52 which includes a drain coupled through current source 54 to power supply conductor 22 and a source coupled to power supply conductor 32. Capacitor 56 is coupled between the gate of transistor 52 and output 58 at the drain of transistor 52 creating a dominate pole for suppressing switching noise into the gate of transistor 52 from switching circuit 50. Switching circuit 50 is responsive to inverted control signal $\overline{CLK}$ for controlling its contact closure. CLK and $\overline{CLK}$ are complementary and non-overlapping control signals. Switching circuits 38, 42, 46 and 50 may comprise a transistor operating in response to control signals CLK and $\overline{CLK}$ as is understood.

A basic operational description of op amp 10 proceeds as follows. With switching circuit 50 closed, when the signal applied at input 12 is less than that applied at input 14, the potential at node 30 falls, removing gate drive to transistor 52 and allowing the voltage at output 58 to increase as is well known. Conversely, when the signal applied at input 12 is greater than that applied at input 14, the potential at node 30 rises, increasing the gate drive to transistor 52 and causing the voltage at output 58 to decrease.

Ideally, with equal potentials applied at inputs 12 and 14 (zero differential input signal) a current $I_{16}$ flows through transistors 16 and 24 equal to current $I_{18}$ flowing through transistors 18 and 26. Actually, transistor 44 is sized to conduct approximately 15% of the nominal current $I_{16}$ while transistor 24 conducts the remaining 85% of the nominal current $I_{16}$. Likewise, transistor 36 conducts approximately 15% of the nominal current $I_{18}$ while transistor 26 conducts the remaining 85%. Unfortunately, op amp 10 may contain inherent mismatches between transistors 16, 18, 24 and 26, e.g. differences in threshold voltages and geometric dimensions, which can cause an error current $\Delta I$ to flow even with a zero differential input signal. Thus, transistor 18 may conduct current $I_{18}+\Delta I$. Moreover, any leakage or error voltage on capacitors 40 and 48 may even reflect back to inputs 12 and 14 by the ratio of the transconductances $G_m$ of transistors 24 and 26 to transistors 16 and 18 thereby increasing the effect of the offset error.

The offset compensation of op amp 10 is provided during an auto-zero phase, wherein the control signal CLK closes switching circuits 38, 42 and 46 while the control signal $\overline{CLK}$ opens switching circuit 50 to isolate the output drive circuitry 52–56. The differential input signal is zero with switching circuit 42 closed. Assume that transistor 16 conducts current $I_{16}$ while transistor 18 conducts nominal current $I_{18}$ plus the error current $\Delta I$ with the zero differential input signal due to the amplifier mismatches. With switching circuits 38 and 46 closed, current $I_{16}$ charges capacitor 48 while current $I_{18}+\Delta I$ charges capacitor 40. Nodes 28 and 30 are pulled to one gate-source voltage ($V_{GS}$) by transistors 44 and 36, respectively, since each operates as a diode with switching circuits 46 and 38 closed. The voltage stored across capacitors 40 and 48 is thus representative of the input offset voltage necessary to counter the transistor mismatch effects.

When capacitors 40 and 48 are fully charged the auto-zero phase is complete and switching circuits 38, 42 and 46 are opened while switching circuit 50 is closed by alternate states of control signals CLK and $\overline{CLK}$, respectively. The voltage across capacitor 48 maintains the 85% –15% distribution of current $I_{16}$ between transistors 24 and 44. Since the gate of transistor 26 is coupled to the gate and drain of transistor 24, the same magnitude of current (85% $I_{18}$) flows through transistor 26 by nature of their current mirror arrangement. The charge on capacitor 40 from current $I_{18}+\Delta I$ during the auto-zero phase is such that transistor 36 conducts 15% of $I_{18}$ plus the error current $\Delta I$. Thus by removing the error current $\Delta I$ from the drain-source conduction paths of transistors 24 and 26, node 28 tracks node 30 with an equal potential. The differential voltage input signal is thus compensated for the internal offset error. Notably, the offset compensation reduces in effectiveness as the voltages across capacitors 40 and 48 decay from discharge leakage. Therefore, the auto-zero phase should be repeated over intervals of say 1.0 microsecond (1 MHz control signals CLK and $\overline{CLK}$) given 1.0 picofarads capacitors 40 and 48 and a 5.0 MHz closed loop bandwidth for op amp 10.

Thus, an advantage of the present invention is the technique of storing respective voltages across capacitors 40 and 48 representative of the input offset voltage which is then used to bias transistors 36 and 44 coupled in parallel to the differential-to-single-ended converter conduction path for removing error signals therefrom. By using similar offset cancellation circuits 36–40 and 44–48 at nodes 30 and 28 with capacitors 40 and 48 referenced to ground, op amp 10 may be configured for both inverting and non-inverting modes of operation, unlike the prior art where the series capacitor is subject to errors from parasitic capacitance at the input terminal of the op amp.

Figure 2:
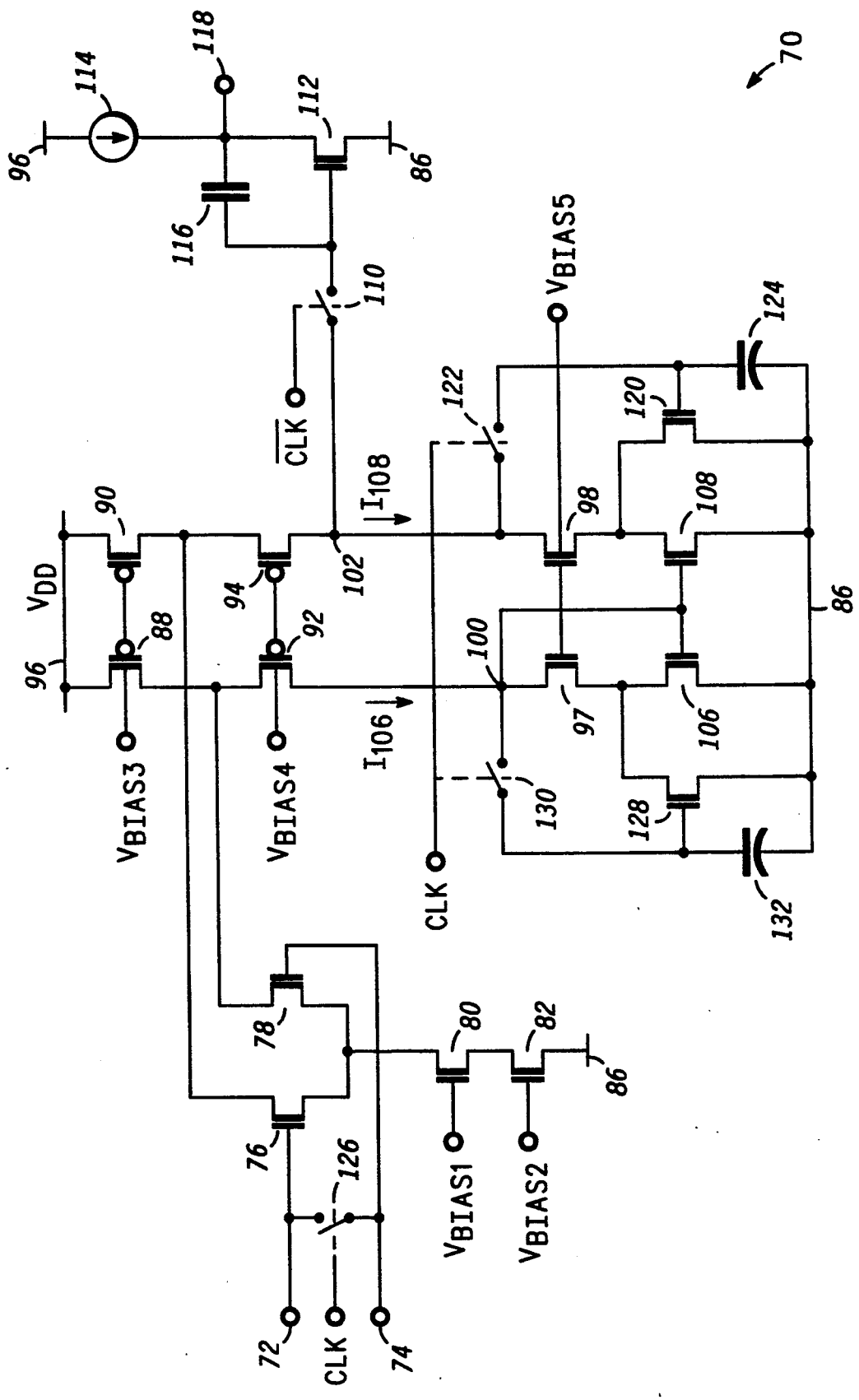
FIG. 2 is a schematic diagram illustrating an alternate embodiment of offset compensation for a CMOS amplifier.

Another embodiment of the present invention is illustrated in FIG. 2 including a differential input stage and a cascoded differential-to-single-ended converter of operational amplifier 70. A differential input signal is applied through inputs 72 and 74 at the gates of transistors 76 and 78, respectively. The sources of transistors 76 and 78 are coupled together through a cascoded current source formed of transistors 80 and 82 to power supply conductor 86 operating at ground potential. The gates of transistors 80 and 82 are responsive to $V_{BIAS1}$ and $V_{BIAS2}$ potentials, respectively. The drains of transistors 76 and 78 are coupled to the drains of transistors 88 and 90 and to the sources of transistors 92 and 94, respectively. Transistors 88 and 90 each include a source connected to power supply conductor 96 operating at $V_{DD}$ and a gate coupled for receiving a $V_{BIAS3}$ potential. The gates of transistors 92 and 94 are responsive to a $V_{BIAS4}$ potential, while the drains of the same are coupled to the drains of transistors 97 and 98 at nodes 100 and 102, respectively. The gates of transistors 97 and 98 are coupled together for receiving a $V_{BIAS5}$ potential, and the sources of transistors 97 and 98 are coupled through the drain-source conduction paths of transistors 106 and 108, respectively, to power supply conductor 86. The gates of transistors 106 and 108 are coupled together to node 100. The aforedescribed configuration of transistors 76-108 comprise a conventional differential input stage with cascoded differential-to-single-ended converter for providing an output signal at node 102. Transistor pair 97-98 is optional with the cascode arrangement and provides improved AC and DC performance by increasing the amplifier gain.

The single-ended output signal at node 102 is applied through switching circuit 110 to the gate of transistor 112 which includes a drain coupled through current source 114 to power supply conductor 96 and a source coupled to power supply conductor 86. Switching circuit 110 is responsive to inverted control signal $\overline{CLK}$ for controlling its contact closure. Capacitor 116 is coupled between the gate of transistor 112 and output 118 at the drain of transistor 112. The dominate pole of capacitor 116 filters the signal at the gate of transistor 112 removing switching noise from the closure of switching circuit 110.

The operation of op amp 70 as described thus far is already known in the art. Briefly, when the signal applied at input 72 is less than that applied at input 74, the potential at node 102 rises, increasing gate drive to transistor 112 and causing the voltage at output 118 to decrease. Conversely, when the signal applied at input 72 is greater than that applied at input 74, the potential at node 102 falls, removing the gate drive from transistor 112 and allowing the voltage at output 118 to increase.

As part of the present invention an offset cancellation circuit is provided by transistor 120, switching circuit 122 and capacitor 124. Transistor 120 includes a drain coupled to the drain of transistor 108 and a source coupled to power supply conductor 86. Switching circuit 122 is coupled between node 102 and the gate of transistor 120, while capacitor 124 is coupled between the gate and source of transistor 120. Switching circuit 126 is coupled between inputs 72 and 74 for zeroing the differential input signal. For balanced operation, another offset compensation circuit includes transistor 128, switching circuit 130 and capacitor 132. Transistor 128 has its drain coupled to the drain of transistor 106 and source coupled to power supply conductor 86. Switching circuit 130 is coupled between node 100 and the gate of transistor 128, and capacitor 132 is coupled between the gate and source of transistor 128. Switching circuits 122, 126 and 130 may comprise two serially coupled transistors; one transistor for making and breaking the conduction path and another optional "dummy load" transistor having its drain and coupled together for absorbing charge injected at the contact closure thereof. The switching transistor of each switching circuit is responsive to control signal CLK for controlling the contact closure, while the "dummy load" transistor receives inverted control signal $\overline{CLK}$.

Ideally, with equal potentials applied at inputs 72 and 74 (zero differential input signal) a current $I_{106}$ flows through transistors 97 and 106 equal to current $I_{108}$ flowing through transistors 98 and 108. Actually, transistor 128 is sized to conduct approximately 15% of the nominal current $I_{106}$ while transistor 106 conducts the remaining 85% of the nominal current $I_{106}$. Likewise, transistor 120 conducts approximately 15% of the nominal current $I_{108}$ while transistor 108 conducts the remaining 85%. Unfortunately, op amp 70 may contain inherent mismatches between transistors 76-108 which can cause an error current $\Delta I$ to flow even with a zero differential input signal. Thus, transistor 98 may conduct current $I_{108} + \Delta I$.

Offset Compensation of op amp 70 is provided during an auto-zero phase, wherein the control signal CLK closes switching circuits 122, 126 and 130 while the control signal $\overline{CLK}$ opens switching circuit 110 to isolate the output drive circuitry 112-116. The differential input signal is zero with switching circuit 126 closed. Assume that transistor 97 conducts current $I_{106}$ while transistor 98 conducts current $I_{108}$ plus the error current $\Delta I$ with the zero differential input signal due to the amplifier mismatches. With switching circuits 122 and 130 closed, current $I_{106}$ charges capacitor 132 while current $I_{108} + \Delta I$ charges capacitor 124. Nodes 100 and 102 are pulled to one gate-source voltage ($V_{GS}$) by transistors 128 and 120, respectively, since each operates as a diode with switching circuits 130 and 122 closed. The voltage stored across capacitors 130 and 132 is representative of the input offset voltage necessary to counter the transistor mismatch effects.

When capacitors 124 and 132 are fully charged the auto-zero phase is complete and switching circuits 122, 126 and 130 are opened while switching circuit 110 is closed by alternate states of complementary control signals CLK and $\overline{CLK}$, respectively. The voltage across capacitor 132 maintains the 85%-15% distribution of current $I_{106}$ between transistors 106 and 128. Since the gate of transistor 108 is coupled to node 100, the same magnitude of current (85% $I_{108}$) flows through transistor 108 by nature of their current mirror arrangement. The charge on capacitor 124 from current $I_{108} + \Delta I$ during the auto-zero phase is such that transistor 120 conducts 15% of $I_{108}$ plus the error current $\Delta I$. Thus by removing the error current $\Delta I$ from the drain-source conduction paths of transistors 106 and 108, node 100 tracks node 102 with an equal potential as the differential input signal is compensated for the internal offset error. The balanced offset cancellation is valid for both inverting and non-inverting configurations of op amp 70.

Figure 3:
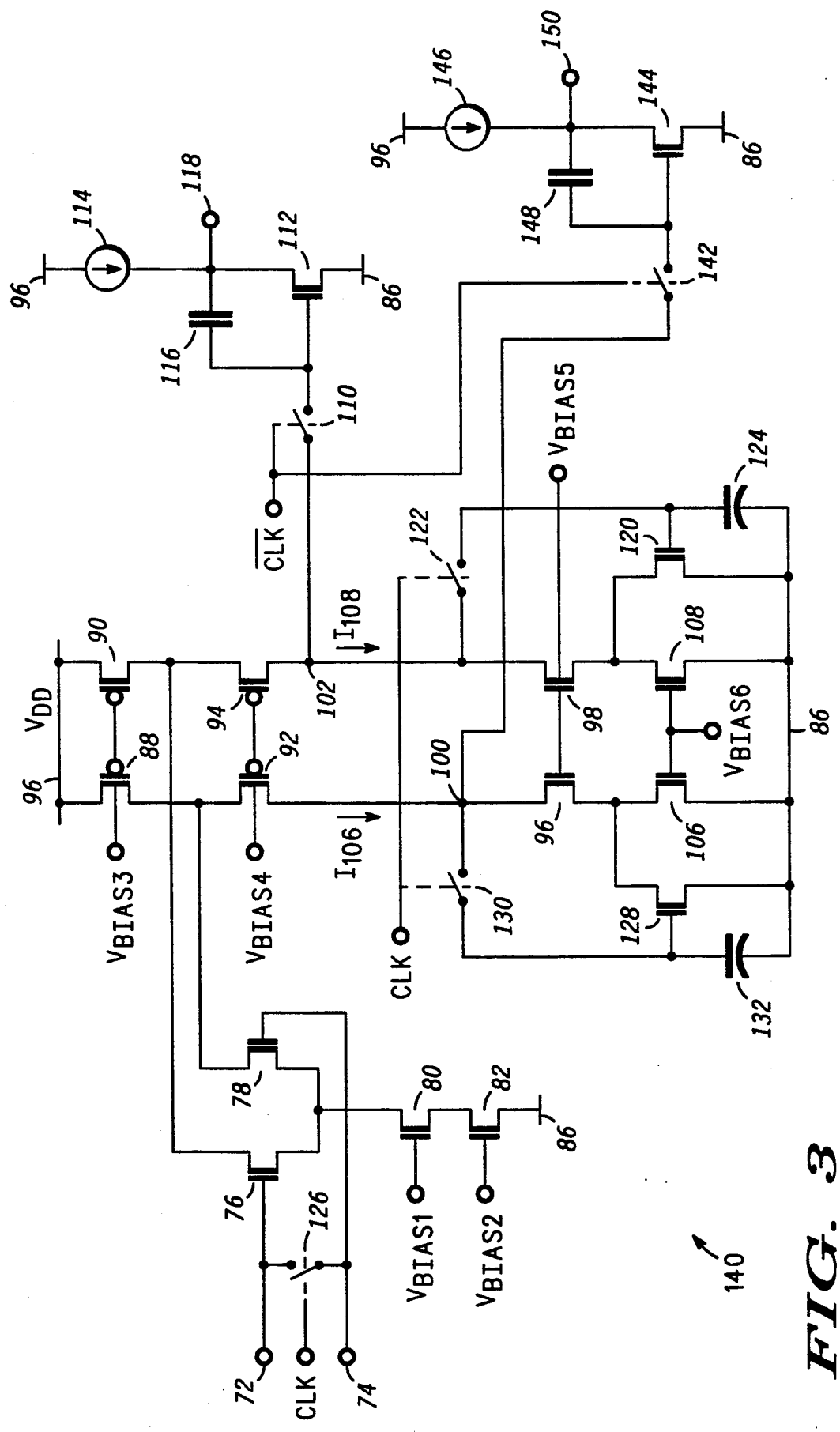
FIG. 3 is a schematic diagram illustrating a differential embodiment of offset compensation for a CMOS amplifier.

In another embodiment shown in FIG. 3, the connection between the gates of transistors 106 and 108 and node 100 may be removed from op amp 140 for providing full differential output signals. A bias voltage $V_{BIAS6}$ is therefore applied at the gates of transistors 106 and 108. Otherwise, components having a similar function are given the same reference numbers used in FIG. 2. Another output drive circuit is provided wherein the output signal developed at node 100 is applied through switching circuit 142 to the gate of transistor 144 which includes a drain coupled through current source 146 to power supply conductor 96 and a source coupled to power supply conductor 86. Switching circuit 142 is also responsive to inverted control signal $\overline{CLK}$ for controlling its contact closure. Capacitor 148 is coupled between the gate of transistor 144 and output 150 at the drain of transistor 144. The dominate pole of capacitor 148 filters the signal at the gate of transistor 144 removing switching noise from the closure of switching circuit 142.

Again, an advantage of the present invention is the technique of storing respective voltages across capacitors 124 and 132 representative of the input offset voltage which is then used to bias transistors 120 and 128 coupled in parallel to the conduction path (88-108) for removing error signals therefrom. By using offset cancellation circuits 120-124 and 128-132 at nodes 100 and 102, op amp 70 may be configured for both inverting and non-inverting modes of operation.

Figure 4:
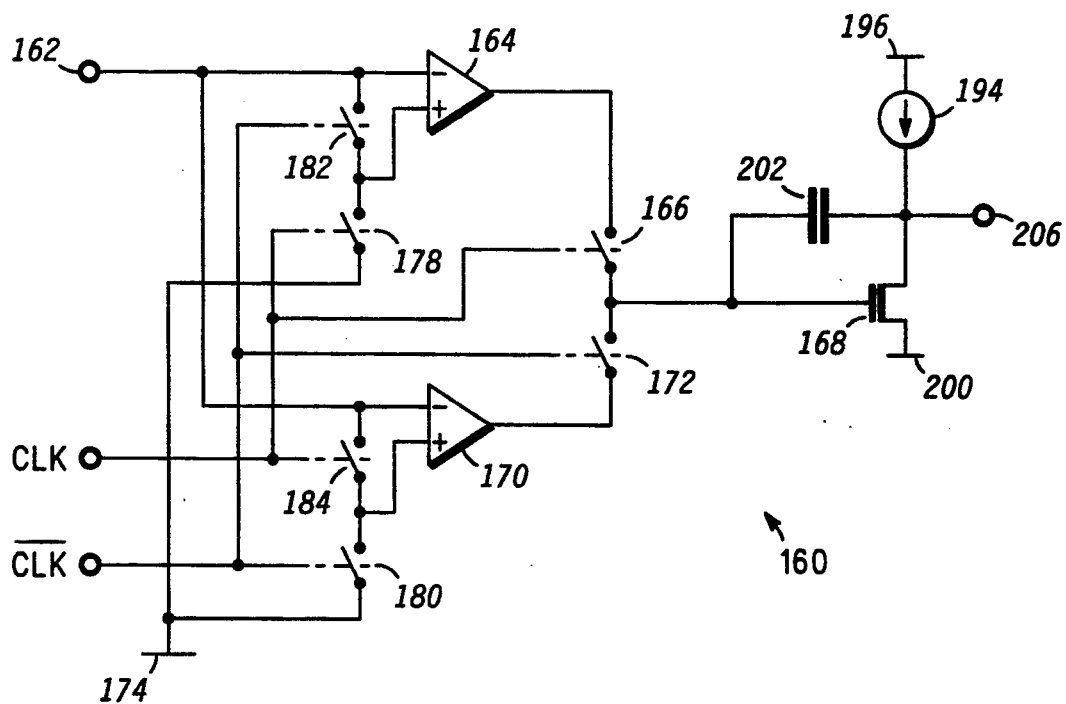
FIG. 4 is a schematic and block diagram illustrating continuous time operation with offset compensation.

Turning to FIG. 4 there is shown an operational amplifier combination 160 for continuous time operation. An input signal is applied at input 162 at the inverting input of amplifier 164. The output of amplifier 164 is coupled through switching circuit 166 to the gate of transistor 168. The input signal is also applied at the inverting input of amplifier 170, the output of which is coupled through switching circuit 172 to the gate of transistor 168. A reference potential from node 174 is applied through switching circuit 178 to the non-inverting input of amplifier 164 in response to control signal CLK. Alternately, the same reference potential is applied through switching circuit 180 to the non-inverting input of amplifier 170 in response to control signal $\overline{CLK}$. Again, CLK and $\overline{CLK}$ are complementary and non-overlapping control signals. Switching circuit 182 and 184 are coupled between the inverting and non-inverting inputs of amplifiers 164 and 170, respectively, and responsive to control signals $\overline{CLK}$ and CLK for controlling the contact closure thereof. Transistor 168 includes a drain coupled through current source 194 to power supply conductor 196 operating at a positive potential such as $V_{DD}$ and a source coupled to power supply conductor 200 operating at ground potential. The drain and gate of transistor 168 are connected by capacitor 202. Output 206 is provided at the drain of transistor 168.

Amplifiers 164 and 170 are internally compensated for offset error as described for op amp 70. Switching circuits 182 and 184 are equivalent to switching circuit 126 of FIGS. 2 and 3. During a first phase of operation, control signal CLK closes switching circuits 166, 178 and 184 while inverted control signal $\overline{CLK}$ opens switching circuits 172, 180 and 182. Amplifier 170 auto-zeroes with switching circuit 184 closed as described for op amp 70. The input signal from input 162 is processed through amplifier 164 which was auto-zeroed during the previous cycle. During a second phase of operation, control signal CLK opens switching circuits 166, 178 and 184 while inverted control signal $\overline{CLK}$ closes switching circuits 172, 180 and 182. Now amplifier 164 auto-zeroes while the input signal from input 162 processes through amplifier 170. Thus, the dual operation of amplifier circuit 160 allows continuous time operation wherein one amplifier auto-zeroes while the other op amp is processing the input signal. The differential embodiment of FIG. 3 may also be supported in amplifiers 164 and 170 of FIG. 4 by duplicating output drive circuit like 168, 194 and 202 and switching circuits like 166 and 172.

Hence, what has been provided is a novel operational amplifier in both inverting and non-inverting configurations wherein a voltage representative of the offset error is stored across first and second capacitors which control respective transistors operating in parallel with the conduction paths of the differential-to-single-ended converter for extracting error currents therefrom and providing internal offset voltage cancellation. The internal compensation also allows two operational amplifiers to work together such that one amplifier auto-zeroes while the other is processing input signal for providing continuous time operation.

We claim:
1. An amplifier circuit, comprising:
   a differential transistor input stage having first and second inputs coupled for receiving a differential input stage having first and second outputs for producing first and second differentially related output signals;
   first means for converting said first and second differentially related output signals received at first and second inputs from said differential transistor input stage to a single-ended output signal, said first means including,
   (a) a first transistor having a gate, a drain and a source, said source being coupled to a first power supply conductor, said drain being coupled to said second input of said first means for providing said single-ended output signal, and
   (b) a second transistor having a gate, a drain and a source, said source being coupled to said first power supply conductor, said gates of said first and second transistors being coupled together to said drain of said second transistor at said first input of said first means;
   a third transistor having a gate, a drain and a source, said drain being coupled to said first input of said first means, said source being coupled to said first power supply conductor;
   a first capacitor coupled between said gate of said third transistor and said first power supply conductor;
   a first switching circuit coupled between said first input of said first means and said gate of said third transistor and operating in response to a switch control signal for charging said first capacitor such that said third transistor removes any error signal developed by mismatches in the amplifier circuit;
   a fourth transistor having a gate, a drain and a source, said drain being coupled to said second input of said first means, said source being coupled to said first power supply conductor;
   a second capacitor coupled between said gate of said fourth transistor and said first power supply conductor; and
   a second switching circuit coupled between said second input of said first means of said gate of said fourth transistor and operating in response to said switch control signal for charging said second capacitor.

2. The amplifier of claim 1 wherein said differential transistor input stage includes:
   a fifth transistor having a gate, a drain and a source, said drain being coupled to said drain of said third transistor;
   a sixth transistor having a gate, a drain and a source, said drain being coupled to said drain of said fourth transistor, said gates of said fifth and sixth transistors being coupled for receiving said differential input signal;

current supply means for providing a current of predetermined magnitude coupled between a second power supply conductor and said sources of said fifth and sixth transistors; and a third switching circuit coupled between said gates of said fifth and sixth transistors for zeroing said differential input signal in response to said switch control signal.

3. An amplifier circuit, comprising:

a differential transistor input stage having first and second inputs coupled for receiving a differential input signal and having first and second outputs for producing first and second differentially related output currents;

a first transistor having a gate, a drain and a source, said source being coupled to a first source of operating potential, said gate being coupled for receiving a first bias potential, said drain being coupled to said first output of said differential transistor input stage;

a second transistor having a gate, a drain and a source, said source being coupled to said first source of operating potential, said gate being coupled for receiving said first bias potential, said drain being coupled to said second output of said differential transistor input stage;

a third transistor having a gate, a drain and a source, said source being coupled to said drain of said first transistor, said gate being coupled for receiving a second bias potential;

a fourth transistor having a gate, a drain and a source, said source being coupled to said drain of said second transistor, said gate being coupled for receiving said second bias potential;

a fifth transistor having a gate, a drain and a source, said drain being coupled to said drain of said third transistor, said source being coupled to a second source of operating potential;

a sixth transistor having a gate, a drain and a source, said drain being coupled to said drain of said fourth transistor, said source being coupled to said second source of operating potential, said gates of said fifth and sixth transistors being coupled together to said drain of said third transistor;

a seventh transistor having a gate, a drain and a source, said drain being coupled to said drain of said sixth transistor, said source being coupled to said second source of operating potential;

a first capacitor coupled between said gate of said seventh transistor and said second source of operating potential; and a first switching circuit coupled between said drain of said fourth transistor and said gate of said seventh transistor and operating in response to a switch control signal for charging said first capacitor such that said seventh transistor removes any error signal developed by mismatches in the amplifier circuit.

4. The amplifier of claim 3 further comprising:

an eighth transistor having a gate, a drain and a source, said drain being coupled to said drain of said fifth transistor, said source being coupled to said said second source of operating potential;

a second capacitor coupled between said gate of said eighth transistor and said second source of operating potential; and a second switching circuit coupled between said drain of said third transistor and said gate of said eighth transistor and operating in response to said switch control signal for charging said second capacitor.

5. The amplifier of claim 4 further comprising:

a ninth transistor having a gate, a drain and a source, said drain being coupled to said drain of said third transistor, said source being coupled to said drain of said fifth transistor; and a tenth transistor having a gate, a drain and a source, said drain being coupled to said drain of said fourth transistor, said source being coupled to said drain of said sixth transistor, said gates of said ninth and tenth transistors being coupled together for receiving a third bias potential.

6. The amplifier of claim 5 wherein said differential transistor input stage includes:

an eleventh transistor having a gate, a drain and a source, said drain being coupled to said drain of said first transistor;

a twelfth transistor having a gate, a drain and a source, said drain being coupled to said drain of said second transistor, said gates of said eleventh and twelfth transistors being coupled for receiving said differential input signal;

a thirteenth transistor having a gate, a drain and a source, said drain being coupled to said sources of said eleventh and twelfth transistors, said gate being coupled for receiving a fourth bias potential;

a fourteenth transistor having a gate, a drain and a source, said drain being coupled to said source of said thirteenth transistor, said gate being coupled for receiving a fifth bias potential, said source being coupled to said second source of operating potential; and a third switching circuit coupled between said gates of said eleventh and twelfth transistors for zeroing said differential input signal in response to said switch control signal.

7. An amplifier circuit for providing continuous processing of an input signal while providing offset cancellation, comprising:

a first amplifier having first and second inputs and an output, said first input being coupled for receiving the input signal, said first amplifier including, (a) a differential transistor input stage having first and second inputs coupled for receiving a differential input signal and having first and second outputs for producing first and second differentially related output currents, (b) a first transistor having a gate, a drain and a source, said source being coupled to a first source of operating potential, said gate being coupled for receiving a first bias potential, said drain being coupled to said first output of said differential transistor input stage, (c) a second transistor having a gate, a drain and a source, said source being coupled to said first source of operating potential, said gate being coupled for receiving said first bias potential, said drain being coupled to said second output of said differential transistor input stage, (d) a third transistor having a gate, a drain and a source, said source being coupled to said drain of said first transistor, said gate being coupled for receiving a second bias potential, (e) a fourth transistor having a gate, a drain and a source, said source being coupled to said drain of said second transistor, said gate being coupled for receiving said second bias potential, said drain being coupled to said output of said first amplifier, (f) a fifth transistor having a gate, a drain and a source, said drain being coupled to said drain of said third transistor, said source being coupled to a second source of operating potential, (g) a sixth transistor having a gate, a drain and a source, said drain being coupled to said drain of said fourth transistor, said source being coupled to said second source of operating potential, said gates of said third and fourth transistors being coupled together to said drain of said third transistor, (h) a seventh transistor having a gate, a drain and a source, said drain being coupled to said drain of said sixth transistor, said source being coupled to said second source of operating potential, (i) a first capacitor coupled between said gate of said seventh transistor and said second source of operating potential, and (j) a first switching circuit coupled between said drain of said fourth transistor and said gate of said seventh transistor;

a second amplifier having first and second inputs and an output, said first input being coupled for receiving the input signal;

first switching means for enabling and disabling a conduction path between said first and second inputs of said first amplifier in response to a first switch control signal;

second switching means for enabling and disabling a conduction path between a reference potential and said second input of said first amplifier in response to a second switch control signal;

third switching means for enabling and disabling a conduction path between said first and second inputs of said second amplifier in response to said second switch control signal;

fourth switching means for enabling and disabling a conduction path between said reference potential and said second input of said second amplifier in response to said first switch control signal;

fifth switching means for enabling and disabling a conduction path between said output of said first amplifier and an output node in response to said second switch control signal; and sixth switching means for enabling and disabling a conduction path between said output of said second amplifier and said output node in response to said first switch control signal;

wherein said first amplifier performs offset cancellation while said second amplifier is processing the input signal when said first switch control signal is activated and said second amplifier performs offset cancellation while said first amplifier is processing the input signal when said second switch control signal is activated.

8. The amplifier circuit of claim 7 wherein said first amplifier further comprises:

an eighth transistor having a gate, a drain and a source, said drain being coupled to said drain of said fifth transistor, said source being coupled to said said second source of operating potential;

a second capacitor coupled between said gate of said eighth transistor and said second source of operating potential; and a second switching circuit coupled between said drain of said third transistor and said gate of said eighth transistor and operating in response to said switch control signal for charging said second capacitor.

9. The amplifier circuit of claim 8 wherein said first amplifier further comprises:

a ninth transistor having a gate, a drain and a source, said drain being coupled to said drain of said third transistor, said source being coupled to said drain of said fifth transistor; and a tenth transistor having a gate, a drain and a source, said drain being coupled to said drain of said fourth transistor, said source being coupled to said drain of said sixth transistor, said gates of said ninth and tenth transistors being coupled together for receiving a third bias potential.

10. The amplifier circuit of claim 9 wherein said differential transistor input stage includes:

an eleventh transistor having a gate, a drain and a source, said drain being coupled to said drain of said first transistor;

a twelfth transistor having a gate a drain and a source, said drain being coupled to said drain of said second transistor, said gates of said eleventh and twelfth transistors being coupled for receiving said differential input signal;

a thirteenth transistor having a gate, a drain and a source, said drain being coupled to said sources of said eleventh and twelfth transistors, said gate being coupled for receiving a fourth bias potential;

a fourteenth transistor having a gate, a drain and a source, said drain being coupled to said source of said thirteenth transistor, said gate being coupled for receiving a fifth bias potential, said source being coupled to said second source of operating potential; and a third switching circuit coupled between said gates of said eleventh and twelfth transistors for zeroing said differential input signal in response to said switch control signal.

* * * * *